US010963076B2

(12) United States Patent
Choi et al.

(10) Patent No.: US 10,963,076 B2
(45) Date of Patent: Mar. 30, 2021

(54) DISPLAY DEVICE

(71) Applicant: SAMSUNG DISPLAY CO., LTD., Yongin-si (KR)

(72) Inventors: Wonsuk Choi, Yongin-si (KR); Sangjo Lee, Yongin-si (KR); Cheolsu Kim, Yongin-si (KR); Yoonsun Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 147 days.

(21) Appl. No.: 15/417,003

(22) Filed: Jan. 26, 2017

(65) Prior Publication Data

US 2017/0277288 A1    Sep. 28, 2017

(30) Foreign Application Priority Data

Mar. 24, 2016  (KR) .................. 10-2016-0035535

(51) Int. Cl.
| G06F 3/041 | (2006.01) |
| H01L 27/32 | (2006.01) |
| H01L 51/00 | (2006.01) |
| H01L 51/52 | (2006.01) |
| G02F 1/1333 | (2006.01) |

(52) U.S. Cl.
CPC ............ *G06F 3/041* (2013.01); *G06F 3/0412* (2013.01); *H01L 27/323* (2013.01); *H01L 27/3246* (2013.01); *H01L 27/3258* (2013.01); *H01L 27/3276* (2013.01); *H01L 51/0097* (2013.01); *H01L 51/5253* (2013.01); *G02F 1/13338* (2013.01); *G06F 2203/04103* (2013.01);

(Continued)

(58) Field of Classification Search
CPC combination set(s) only.
See application file for complete search history.

(56) References Cited

U.S. PATENT DOCUMENTS 6,184,966 B1    2/2001  Fujita et al.
7,821,009 B2   10/2010  Park
(Continued)

FOREIGN PATENT DOCUMENTS

| CN | 101806970 A | 8/2010 |
| CN | 104347819 A | 2/2015 |

(Continued)

OTHER PUBLICATIONS

U.S. Office Action dated Sep. 27, 2018, issued in U.S. Appl. No. 15/404,057 (23 pages).

(Continued)

*Primary Examiner* — Temesghen Ghebretinsae
*Assistant Examiner* — Sosina Abebe
(74) *Attorney, Agent, or Firm* — Lewis Roca Rothgerber Christie LLP

(57) ABSTRACT

A display device includes a substrate including a bending area located between a first region and a second region, and bent around a bending axis extending in a first direction, a first conductive layer above the substrate, and extending from the first region to the second region through the bending area, a second conductive layer above the first conductive layer, and extending from the first region to the second region through the bending area, and an organic insulating layer between the first conductive layer and the second conductive layer.

27 Claims, 11 Drawing Sheets

(52) U.S. Cl.
CPC .............. *G06F 2203/04111* (2013.01); *H01L 2251/5338* (2013.01); *Y02E 10/549* (2013.01)

(56) References Cited

U.S. PATENT DOCUMENTS

| | | |
|---|---|---|
| 8,377,762 B2 | 2/2013 | Eguchi et al. |
| 8,698,189 B2 | 4/2014 | Park et al. |
| 8,933,451 B2 | 1/2015 | Kim et al. |
| 9,219,102 B2 | 12/2015 | Choi |
| 9,276,055 B1* | 3/2016 | Son .................. H01L 27/3276 |
| 9,287,342 B2 | 3/2016 | Kwon et al. |
| 9,293,730 B2 | 3/2016 | An |
| 9,543,370 B2 | 1/2017 | Tsai et al. |
| 9,659,966 B2 | 5/2017 | Kwak et al. |
| 9,698,162 B2 | 7/2017 | Jeong |
| 9,882,152 B2 | 1/2018 | Namkung et al. |
| 9,991,326 B2 | 6/2018 | Iijima et al. |
| 10,020,462 B1 | 7/2018 | Ai et al. |
| 2006/0169989 A1 | 8/2006 | Bhattacharya et al. |
| 2008/0079889 A1 | 4/2008 | Lee et al. |
| 2008/0106532 A1 | 5/2008 | Choi et al. |
| 2011/0227846 A1 | 9/2011 | Imazeki |
| 2012/0162099 A1 | 6/2012 | Yoo et al. |
| 2013/0148312 A1 | 6/2013 | Han et al. |
| 2014/0055702 A1 | 2/2014 | Park et al. |
| 2014/0097408 A1* | 4/2014 | Kim .................. H01L 27/3237 257/40 |
| 2014/0217373 A1 | 8/2014 | Youn et al. |
| 2014/0217397 A1 | 8/2014 | Kwak et al. |
| 2014/0232956 A1 | 8/2014 | Kwon et al. |
| 2014/0254111 A1 | 9/2014 | Yamazaki et al. |
| 2014/0346448 A1* | 11/2014 | You .................. H01L 51/5228 257/40 |
| 2014/0353670 A1 | 12/2014 | Youn et al. |
| 2015/0102298 A1 | 4/2015 | Namkung et al. |
| 2015/0116959 A1 | 4/2015 | Namkung |
| 2015/0171113 A1* | 6/2015 | Honjo .................. H01L 27/1222 257/72 |
| 2015/0179728 A1 | 6/2015 | Kwon et al. |
| 2015/0380679 A1* | 12/2015 | Fujiyoshi ............ H01L 51/5253 257/99 |
| 2016/0014883 A1 | 1/2016 | Cho et al. |
| 2016/0066409 A1* | 3/2016 | Kwon .................. H05K 1/028 174/254 |
| 2016/0195901 A1 | 7/2016 | Kauhaniemi et al. |
| 2016/0204185 A1 | 7/2016 | Iijima et al. |
| 2016/0211482 A1 | 7/2016 | Namkung |
| 2016/0218305 A1 | 7/2016 | Kim et al. |
| 2016/0239133 A1 | 8/2016 | Ko et al. |
| 2016/0336523 A1 | 11/2016 | Kwon et al. |
| 2017/0062532 A1 | 3/2017 | Jeong |
| 2017/0092230 A1* | 3/2017 | Kuwabara ........... H01L 27/3276 |
| 2017/0147117 A1 | 5/2017 | Song et al. |
| 2017/0237025 A1 | 8/2017 | Choi et al. |
| 2017/0250237 A1* | 8/2017 | Cheng .................. H01L 51/0097 |
| 2017/0329368 A1 | 11/2017 | Rho et al. |
| 2018/0019418 A1 | 1/2018 | Sonoda et al. |

FOREIGN PATENT DOCUMENTS

| | | |
|---|---|---|
| CN | 104733498 A | 6/2015 |
| JP | 3102392 | 10/2000 |
| JP | 2013-174692 | 9/2013 |
| KR | 2002-0076400 | 10/2002 |
| KR | 10-2008-0031091 | 4/2008 |
| KR | 10-2008-0040505 | 5/2008 |
| KR | 10-2012-0044019 | 5/2012 |
| KR | 10-2013-0007053 | 1/2013 |
| KR | 10-2014-0045193 | 4/2014 |
| KR | 10-2014-0103025 | 8/2014 |
| KR | 10-2014-0108914 | 9/2014 |
| KR | 10-2015-0043970 | 4/2015 |
| KR | 10-2015-0049303 | 5/2015 |
| KR | 10-2015-0061769 | 6/2015 |
| KR | 10-2015-0074808 | 7/2015 |
| TW | 200629562 A | 8/2006 |
| WO | 2013/015141 A1 | 1/2013 |
| WO | 2014/136856 A1 | 9/2014 |
| WO | 2016/032175 A1 | 3/2016 |
| WO | 2016/053246 A1 | 4/2016 |

OTHER PUBLICATIONS

U.S. Office Action dated Aug. 30, 2017, issued in U.S. Appl. No. 15/270,416 (12 pages).
U.S. Notice of Allowance dated Jan. 5, 2018, issued in U.S. Appl. No. 15/270,416 (10 pages).
U.S. Notice of Allowance dated May 23, 2018, issued in U.S. Appl. No. 15/270,416 (12 pages).
U.S. Notice of Allowance dated Oct. 22, 2018, issued in U.S. Appl. No. 15/270,416 (14 pages).
U.S. Office Action dated Jul. 26, 2018, issued in U.S. Appl. No. 15/948,214 (24 pages).
U.S. Notice of Allowance dated Nov. 23, 2018, issued in U.S. Appl. No. 15/948,214 (15 pages).
U.S. Notice of Allowance dated Mar. 6, 2019, issued in U.S. Appl. No. 15/404,057 (20 pages).
U.S. Notice of Allowance dated Aug. 26, 2020, issued in U.S. Appl. No. 16/507,336 (29 pages).

* cited by examiner

DISPLAY DEVICE

CROSS-REFERENCE TO RELATED APPLICATION

This application claims priority to, and the benefit of, Korean Patent Application No. 10-2016-0035535, filed on Mar. 24, 2016, in the Korean Intellectual Property Office, the disclosure of which is incorporated herein in its entirety by reference.

BACKGROUND

1. Field

One or more embodiments relate to a display device that may reduce or minimize the occurrence of a defect, such as disconnection, during a manufacturing process, while improving a lifespan of the display device.

2. Description of the Related Art

Generally, a display device includes a display portion above a substrate. Visibility of the display device may be improved at various angles, or the area of a non-display area thereof may be reduced by bending at least a portion thereof.

However, in a conventional display device, a defect may occur during a process of manufacturing a bent display device, or the life of the display device may be reduced.

SUMMARY

One or more embodiments include a display device that may reduce or minimize the occurrence of a defect, such as disconnection, that may otherwise occur during a manufacturing process, while also improving a lifespan of the display device. However, such aspects are merely exemplary, and the scope of the inventive concept is not limited by these aspects.

Additional aspects will be set forth in part in the description that follows and, in part, will be apparent from the description, or may be learned by practice of the presented embodiments.

According to one or more embodiments, a display device includes a substrate including a bending area located between a first region and a second region, and bent around a bending axis extending in a first direction, a first conductive layer above the substrate, and extending from the first region to the second region through the bending area, a second conductive layer above the first conductive layer, and extending from the first region to the second region through the bending area, and an organic insulating layer between the first conductive layer and the second conductive layer.

The display device may further include an inorganic insulating layer above the substrate, and having an opening corresponding to the bending area, and an organic layer in at least a portion of the opening.

An upper surface of the organic layer may include a first uneven surface, and an upper surface of the organic insulating layer may include a second uneven surface.

The first uneven surface may include a plurality of first grooves repeated at a first period, and the second uneven surface may include a plurality of second grooves repeated at a second period that is different from the first period.

The second period of the second uneven surface may be less than the first period of the first uneven surface.

The plurality of first grooves may be at an upper surface of the organic layer, and may extend in the first direction, and the plurality of second grooves may be at an upper surface of the organic insulating layer, and may extend in the first direction.

The first uneven surface may include a plurality of first protrusions having a first height, and the second uneven surface may include a plurality of second protrusions in a second direction crossing the first direction and having a second height that is greater than the first height.

The first uneven surface and the second uneven surface may correspond to the opening.

A shape of a lower surface of the second conductive layer that is above the organic insulating layer may correspond to a shape of the organic insulating layer.

The first uneven surface may have a first area, and the second uneven surface may have a second area that is greater than the first area.

A shape of a lower surface of the first conductive layer that is above the organic layer may correspond to a shape of an upper surface of the organic layer.

The organic insulating layer may have a first contact hole in the first region and may have a second contact hole in the second region, and the first conductive layer may be electrically connected to the second conductive layer via the first contact hole and the second contact hole.

The organic insulating layer may have a third contact hole in the bending area, and the first conductive layer may be electrically connected to the second conductive layer via the third contact hole.

The display device may further include a third conductive layer above the inorganic insulating layer in the first region, the first and second conductive layers being electrically connected to the third conductive layer.

The display device may further include a thin film transistor in the first region or the second region, and including a source electrode, a drain electrode, and a gate electrode, and the third conductive layer may include a same material as the gate electrode.

The display device may further include a third conductive layer and a fourth conductive layer above the inorganic insulating layer in the first region, the first conductive layer may be electrically connected to the third conductive layer, and the second conductive layer may be electrically connected to the fourth conductive layer.

The second conductive layer may or may not overlap the first conductive layer.

The display device may further include a thin film transistor in the first region or in the second region, and including a source electrode, a drain electrode, and a gate electrode, and the third conductive layer and the fourth conductive layer may include a same material as the gate electrode.

The display device may further include a thin film transistor in the first region or the second region, and including a source electrode, a drain electrode, and a gate electrode, a planarization layer above the thin film transistor, and covering the thin film transistor, a pixel electrode electrically connected to the thin film transistor, a pixel-defining layer above the planarization layer, and defining a pixel region by exposing a central portion of the pixel electrode, an encapsulation layer covering a display element in the first region, and a touch electrode for a touchscreen above the encapsulation layer, wherein the first conductive layer may include a same material as the source electrode or the drain electrode.

The second conductive layer may include a same material as the touch electrode.

The organic insulating layer may include a same material as the planarization layer or the pixel-defining layer.

The encapsulation layer may include an inorganic encapsulation layer, and an organic encapsulation layer including a same material as the organic insulating layer.

According to one or more embodiments, a display device includes a substrate including a bending area, an inorganic insulating layer on the substrate, and having an opening at the bending area, and an organic layer located at at least a portion of the opening.

The display device may further include a first conductive layer above the inorganic insulating layer and above the organic layer, a second conductive layer above the first conductive layer, and an organic insulating layer between the first conductive layer and the second conductive layer.

The first conductive layer may be electrically connected to the second conductive layer through one or more holes in the organic insulating layer.

At least one of the organic layer, the first conducive layer, or the second conductive layer may include an uneven surface at the bending area for reducing or dispersing stress due to bending at the bending area.

The inorganic insulating layer may include at least one of a buffer layer, a gate insulating layer, or an interlayer insulating layer, and may extend to a thin film transistor in a display area outside the bending area.

According to the above, a display device that may reduce or minimize the occurrence of a defect, such as disconnection, during a manufacturing process, while improving a lifespan of the display device may be implemented. As understood by a person of ordinary skill in the art, the scope of the inventive concept is not limited by these aspects.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
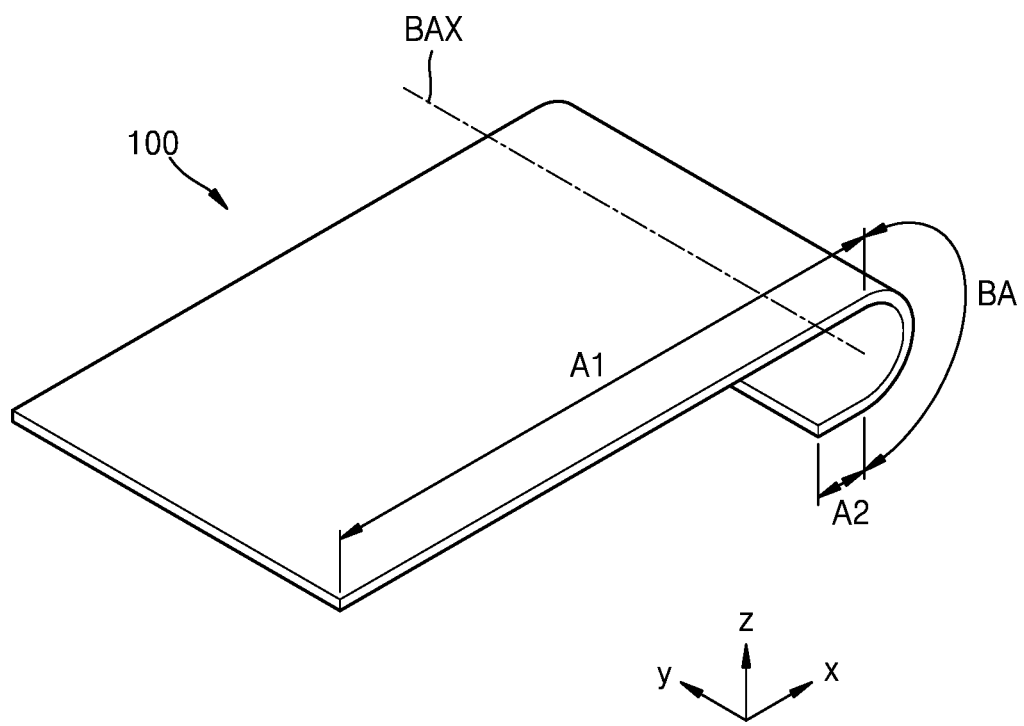
FIG. 1 is a perspective view illustrating a display device according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
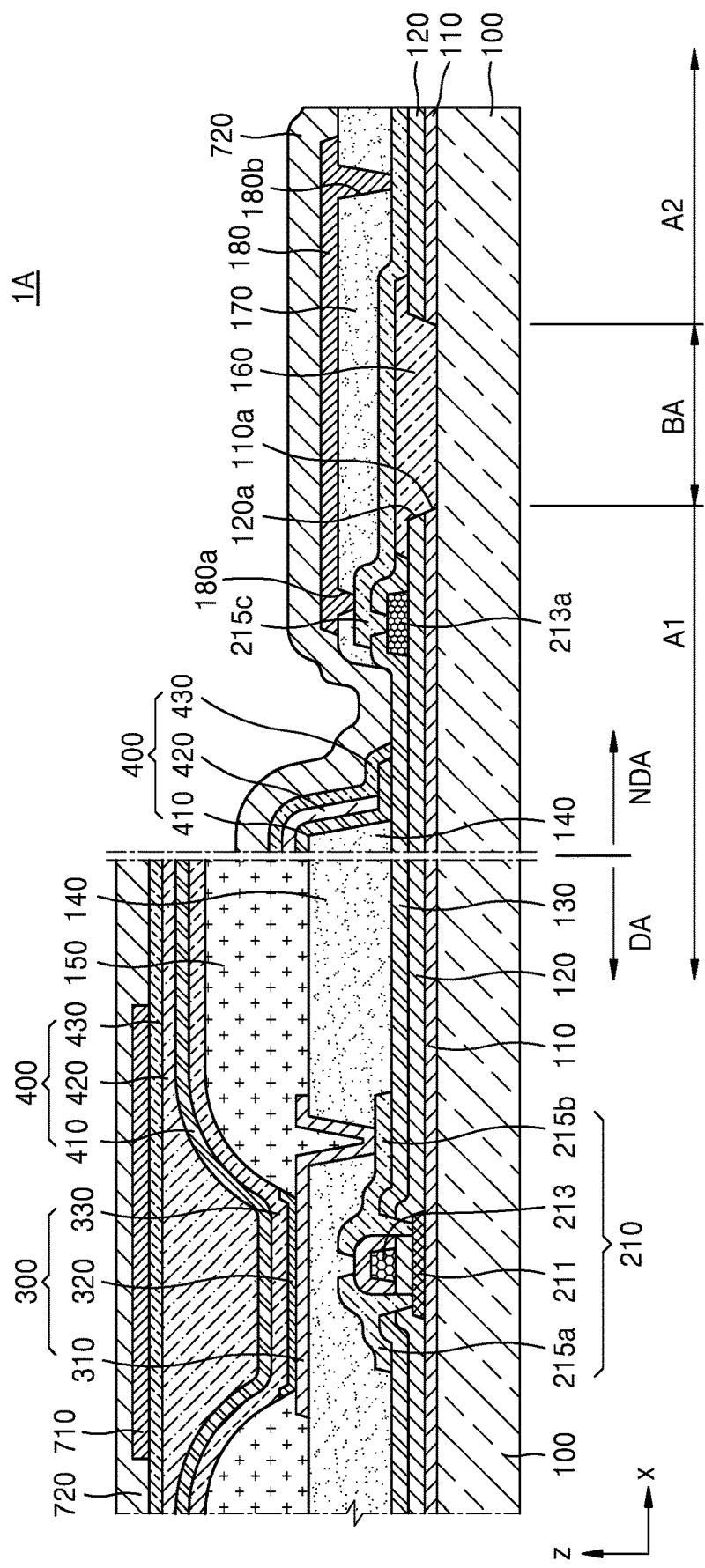
FIG. 2 is a cross-sectional view illustrating a portion of the display device of FIG. 1.

FIG. 1 is a perspective view illustrating a display device 1A according to an embodiment, and FIG. 2 is a cross-sectional view illustrating a portion of the display device 1A of FIG. 1.

As illustrated in FIG. 1, in the display device 1A according to an embodiment, a portion of a substrate 100, which is a portion of the display device 1A, is bent, and the display device 1A has a shape that is partially bent like the substrate 100. However, for convenience of description, FIG. 2 illustrates that the display device 1A is not bent (e.g., FIG. 2 illustrates the display device 1A before it is bent, or illustrates a non-bent portion of the display device 1A). For reference, cross-sectional views or plan views of embodiments below illustrate that the display device 1A is not bent for convenience of illustration and description.

Referring to FIGS. 1 and 2, the substrate 100 of the display device according to an embodiment has a bending area BA extending in a first direction (+y direction). The bending area BA is between a first region A1 and a second region A2 in a second direction (+x direction) that crosses the first direction (+y direction). Also, as illustrated in FIG. 1, the substrate 100 is bent around a bending axis BAX extending in the first direction (+y direction).

The substrate 100 may include various materials having a flexible or bendable characteristic. For example, the substrate 100 may include a polymer resin such as polyethersulphone (PES), polyacrylate (PAR), polyetherimide (PEI), polyethylenen naphthalate (PEN), polyethyleneterephthalate (PET), polyphenylene sulfide (PPS), polyallylate, polyimide (PI), polycarbonate (PC), and/or cellulose acetate propionate (CAP).

The first region A1 includes a display area DA. The first region A1 may include a portion of a non-display area NDA outside the display area DA, as illustrated in FIG. 2. Also, the second region A2 may also include a portion of the non-display area NDA.

A display portion may be in the display area DA of the first area A1. The display portion may include a display element 300, and may display an image to the outside by controlling light emission of the display element 300.

As illustrated in FIG. 2, in addition to the display element 300, a thin film transistor (TFT) 210 may be in the display area DA of the substrate 100, and may be electrically connected to the display element 300. FIG. 2 illustrates that the display element 300 includes an organic light-emitting diode (OLED) in the display area DA. A configuration in which the OLED is electrically connected to the TFT 210 may be understood as a configuration in which a pixel electrode 310 is electrically connected to the TFT 210. A TFT may also be in a circumferential region outside the display area DA of the substrate 100 when suitable. The TFT in the circumferential region may be a portion of a circuit portion for controlling an electric signal applied to the display area DA, for example.

The TFT 210 may include a semiconductor layer 211, a gate electrode 213, a source electrode 215a, and a drain electrode 215b including amorphous silicon, polycrystalline silicon, or an organic semiconductor material.

To secure insulation of the semiconductor layer 211 from the gate electrode 213, a gate insulating layer 120 may be between the semiconductor layer 211 and the gate electrode 213, and may include an inorganic material, such as silicon oxide, silicon nitride, and/or silicon oxynitride. Also, an interlayer insulating layer 130 may be above the gate electrode 213, and may include an inorganic material, such as silicon oxide, silicon nitride, and/or silicon oxynitride. The source electrode 215a and the drain electrode 215b may be above the interlayer insulating layer 130. The insulating layers (e.g., the gate insulating layer 120 and the interlayer insulating layer 130), which include an inorganic material, may be formed by chemical vapor deposition (CVD) or atomic layer deposition (ALD). The same is applied to embodiments described below and modifications thereof.

A buffer layer 110 may be between the TFT 210 having the above structure and the substrate 100, and may include an inorganic material, such as silicon oxide, silicon nitride, and/or silicon oxynitride. The buffer layer 110 may planarize the upper surface of the substrate 100, or may prevent or minimize impurities from the substrate 100, etc. from penetrating into the semiconductor layer 211 of the TFT 210.

Also, a planarization layer 140 may be above the TFT 210. For example, as illustrated in FIG. 2, in the case where an OLED is above the TFT 210, the planarization layer 140 may generally planarize the upper portion of a protective layer covering the TFT 210. The planarization layer 140 may include an organic material, such as acryl, benzocyclobutene (BCB), or hexamethyldisiloxane (HMDSO). Although FIG. 2 illustrates that the planarization layer 140 is a single layer, the planarization layer 140 may include multiple layers, and may be variously modified. Also, as illustrated in FIG. 2, the planarization layer 140 has (e.g., defines, or includes) an opening outside the display area DA to physically separate a portion of the planarization layer 140 in the display area DA from a portion of the planarization layer 140 in the second region A2. This is for preventing external impurities from reaching an inside of the display area DA via the planarization layer 140.

In the display area DA of the substrate 100, the OLED may be above the planarization layer 140, the OLED including the pixel electrode 310, an opposite electrode 330, and an intermediate layer 320 that is between the pixel electrode 310 and the opposite electrode 330, and that includes an emission layer. The pixel electrode 310 is electrically connected to the TFT 210 by contacting one of the source electrode 215a and the drain electrode 215b via an opening formed in the planarization layer 140, as illustrated in FIG. 2.

A pixel-defining layer 150 may be above the planarization layer 140. The pixel-defining layer 150 defines a pixel by having an opening corresponding to sub-pixels, that is, an opening that exposes at least a central portion of the pixel electrode 310. Also, in the case illustrated in FIG. 2, the pixel-defining layer 150 prevents an arc, etc. from occurring at the edge of the pixel electrode 310 by increasing a distance between an edge of the pixel electrode 310 and the opposite electrode 330 above the pixel electrode 310. The pixel-defining layer 150 may include an organic material, such as PI or HMDSO.

The intermediate layer 320 of the OLED may include a low molecular weight material or a polymer material. In the case where the intermediate layer 320 includes a low molecular weight material, the intermediate layer 320 may have a structure in which one or more of a hole injection layer (HIL), a hole transport layer (HTL), an emission layer (EML), an electron transport layer (ETL), an electron injection layer (EIL), etc. are stacked in a single or composite structure. The intermediate layer 320 may include various organic materials, such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by a vacuum deposition method.

In the case where the intermediate layer 320 includes a polymer material, the intermediate layer 320 may have a structure including an HTL and an EML. In this case, the HTL may include a PEDOT, and the EML may include a polymer material, such as a poly-phenylenevinylene (PPV)-based material and a polyfluorene-based material. The intermediate layer 320 may be formed by using screen printing, an inkjet printing method, or laser induced thermal imaging (LITI), etc.

The intermediate layer 320 is not necessarily limited thereto, and may have various structures. Also, the intermediate layer 320 may include a layer integrally formed over a plurality of pixel electrodes 310, and may include a layer patterned to correspond to the plurality of pixel electrodes 310.

The opposite electrode 330 may be above the display area DA, and may cover the display area DA, as illustrated in FIG. 2. That is, the opposite electrode 330 may be integrally formed over a plurality of OLEDs, and may correspond to the plurality of pixel electrodes 310.

Because the OLED may be easily damaged by external moisture or oxygen, etc., an encapsulation layer 400 may protect the OLEDs by covering the OLEDs. The encapsulation layer 400 may cover the display area DA, and may extend outside the display area DA. As illustrated in FIG. 2, the encapsulation layer 400 may include a first inorganic encapsulation layer 410, an organic encapsulation layer 420, and a second inorganic encapsulation layer 430.

The first inorganic encapsulation layer 410 may cover the opposite electrode 330, and may include silicon oxide, silicon nitride, and/or silicon oxynitride. Other layers, such as a capping layer, etc., may be between the first inorganic encapsulation layer 410 and the opposite electrode 330 when suitable.

Because the first inorganic encapsulation layer 410 is formed along a structure therebelow, the upper surface of the first inorganic encapsulation layer 410 is not planarized, as illustrated in FIG. 2. The organic encapsulation layer 420 may cover the first inorganic encapsulation layer 410. Unlike the first inorganic encapsulation layer 410, the upper surface of the organic encapsulation layer 420 may be planarized. Specifically, the upper surface of the organic encapsulation layer 420 may be approximately planarized in a portion corresponding to the display area DA. The organic encapsulation layer 420 may include at least one of PET, PEN, PC, PI, polyethylene sulphonate, polyoxymethylene (POM), PAR, or hexamethyldisiloxane.

The second inorganic encapsulation layer 430 may cover the organic encapsulation layer 420, and may include silicon oxide, silicon nitride, and/or silicon oxynitride. The second inorganic encapsulation layer 430 may prevent exposure of the organic encapsulation layer 420 to the outside by contacting edges of the first inorganic encapsulation layer 410 outside the display area DA.

Because the encapsulation layer 400 includes the first inorganic encapsulation layer 410, the organic encapsulation layer 420, and the second inorganic encapsulation layer 430, even when a crack occurs inside the encapsulation layer 400, the crack may not be allowed to be connected between the first inorganic encapsulation layer 410 and the organic encapsulation layer 420, or between the organic encapsulation layer 420 and the second inorganic encapsulation layer 430, due to properties of the above-described multi-layered structure. Through this, forming of a path via which external moisture or oxygen, etc. penetrates into the display area DA may be prevented or minimized.

In other embodiments, a polarization plate may be above the encapsulation layer 400 by using an optically clear adhesive (OCA). The polarization plate may reduce reflection of external light. For example, in the case where external light passes through the polarization plate, is reflected by the upper surface of the opposite electrode 330, and then passes through the polarization plate again, because the external light passes through the polarization plate twice, the phase of the external light may be changed. As a result, destructive interference may occur due to a phase difference between the phase of the reflected light and the phase of the external light through the polarization plate. Consequently, visibility may improve by reducing the external light reflection. In another embodiment, the polarization plate of the display device may be omitted, and accordingly, external light reflection may be reduced by using a black matrix and a color filter.

A touch electrode 710 of various patterns for a touch-screen function may be above the encapsulation layer 400. When forming the touch electrode 710, a first conductive layer 215c may be formed simultaneously with the touch electrode 710 by using the same material as that of the touch electrode 710. When forming a touch protective layer 720 that covers the touch electrode 710 to protect the touch electrode 710, a protective layer covering the first conductive layer 215c, etc. may also be formed (e.g., simultaneously, or concurrently, formed during a same process). In another embodiment, as illustrated in FIG. 2, the touch protective layer 720 may integrally extend from the display area DA to at least the bending area BA when suitable. As described above, the structure in which the first conductive layer 215c is simultaneously formed with the touch electrode 710 is applicable to display devices described above or below. Unlike this, the first conductive layer 215c may be formed (e.g., concurrently, or simultaneously, formed during a same process) with the opposite electrode 330 by using the same material as that of the opposite electrode 330.

Meanwhile, the buffer layer 110, the gate insulating layer 120, and the interlayer insulating layer 130 including an inorganic material may be collectively referred to as an inorganic insulating layer. The inorganic insulating layer includes, or has, an opening corresponding to the bending area BA. That is, as illustrated in FIG. 2, the buffer layer 110 and the gate insulating layer 120 may respectively include openings 110a and 120a corresponding to the bending area BA. A fact that the opening corresponds to the bending area BA may denote that the opening overlaps the bending area BA. In another embodiment, the interlayer insulating layer 130 may also have an opening corresponding to the respective openings 110a and 120a of the buffer layer 110 and the gate insulating layer 120.

In FIG. 2, the area of the opening is illustrated as the width of the opening, and the area of the bending area BA is illustrated as the width of the bending area BA. Although FIG. 2 illustrates that the area of the opening is the same as the area of the bending area BA, the area of the opening may be greater than the area of the bending area BA, according to another embodiment.

Meanwhile, although FIG. 2 illustrates that the inner lateral surface of the opening 110a of the buffer layer 110 coincides with the inner lateral surface of the opening 120a of the gate insulating layer 120, not all embodiments are limited thereto. In another embodiment, the inner lateral surface of the opening 110a of the buffer layer 110 may be different from the inner lateral surface of the opening 120a of the gate insulating layer 120. In this case, the area of the opening may be defined as, or may be, the area of the two openings 110a and 120a that is a relatively smallest area. FIG. 2 illustrates that the area of the opening 110a is smaller than the area of the opening 120a, and the area of the opening is defined by, or is equal to, the area of the opening 110a of the buffer layer 110.

The display device according to an embodiment includes an organic layer 160 located at (e.g., filling, or filled in) at least a portion of the opening of the inorganic insulating layer. Although FIG. 2 illustrates that the organic layer 160 completely fills the opening, and thus the upper surface of the organic layer 160 is planarized, the organic layer 160 may be disposed along the shape of the opening according to another embodiment. The organic layer 160 may be formed via a separate process, and may be simultaneously formed during a process of forming some layers of the display portion. In the case where the organic layer 160 is simultaneously formed during the process of forming some layers of the display portion, the organic layer 160 may include the same material as that of the planarization layer 140 or the pixel-defining layer 150.

Also, the display device according to the present embodiment includes the first conductive layer 215c. The first conductive layer 215c extends from the first region A1 to the second region A2 through the bending area BA, and is above the organic layer 160. The first conductive layer 215c may be above the inorganic insulating layer, such as the gate insulating layer 120 and/or the interlayer insulating layer 130, in a region(s) where there is no organic layer 160. The first conductive layer 215c may include the same material as that of the source electrode 215a or the drain electrode 215b and may be formed with (e.g., simultaneously or concurrently formed with, or formed during a same process as) the source electrode 215a or the drain electrode 215b.

As described above, although FIG. 2 illustrates, for convenience of description, that the display device is not bent, the display device according to an embodiment includes the substrate 100, etc. bent in the bending area BA as illustrated in FIG. 1. For this purpose, the display device is manufactured such that the substrate 100 is approximately planarized as illustrated in FIG. 2, and then the display device is allowed to have the approximate shape illustrated in FIG. 1 by bending the substrate 100, etc. in the bending area BA. In this case, during a process in which the substrate 100, etc. are bent in the bending area BA, tensile stress may be applied on the first conductive layer 215c.

However, in the display device according to an embodiment, because the inorganic insulating layer has the opening in the bending area BA, a probability that a crack occurs in the inorganic insulating layer is relatively low, and the organic layer 160 may absorb tensile stress that occurs by bending of the substrate 100, etc., and may thus prevent or minimize the occurrence of a defect in the first conductive layer 215c during the bending process.

The display device according to the present embodiment may include a second conductive layer 180 in addition to the first conductive layer 215c. The second conductive layer 180 extends from the first region A1 to the second region A2 through the bending area BA, and is above the first conductive layer 215c. For insulation, an organic insulating layer 170 may be between the first conductive layer 215c and the second conductive layer 180. The second conductive layer 180 may be above the organic insulating layer 170, and may be electrically connected to the first conductive layer 215c via a first contact hole 180a and a second contact hole 180b formed in the organic insulating layer 170 in the first and second regions A1 and A2. For example, the second conductive layer 180 may include the same material as that of the touch electrode 710, although not all embodiments are limited thereto.

Meanwhile, as illustrated in FIG. 2, the first conductive layer 215c may include the same material as that of the source electrode 215a or the drain electrode 215b of the TFT 210. In this case, the second conductive layer 180 may include the same material as that of the touch electrode 710, although the present embodiment is not limited thereto. As another embodiment, the second conductive layer 180 may include the same material as that of the opposite electrode 330, and may be formed when forming the opposite electrode 330 (e.g., the second conductive layer 180 and the opposite electrode 330 may be formed during a same process).

The first conductive layer 215c and the second conductive layer 180 may be electrically connected to each other as described above, and may serve as a wiring (e.g., as an integral wiring) for transferring the same signal. That is, the first conductive layer 215c and the second conductive layer 180 may form a so-called multi-path for transferring the same signal. Therefore, as the substrate 100 is bent in the bending area BA, tensile stress is applied to the first conductive layer 215c and the second conductive layer 180 in the bending area BA, and in this case, even when a crack or disconnection occurs in one of the first and second conductive layers 215c and 180, an electric signal may be transferred via the other conductive layer, and thus a reliable wiring in the bending structure may be implemented.

Figure 3:
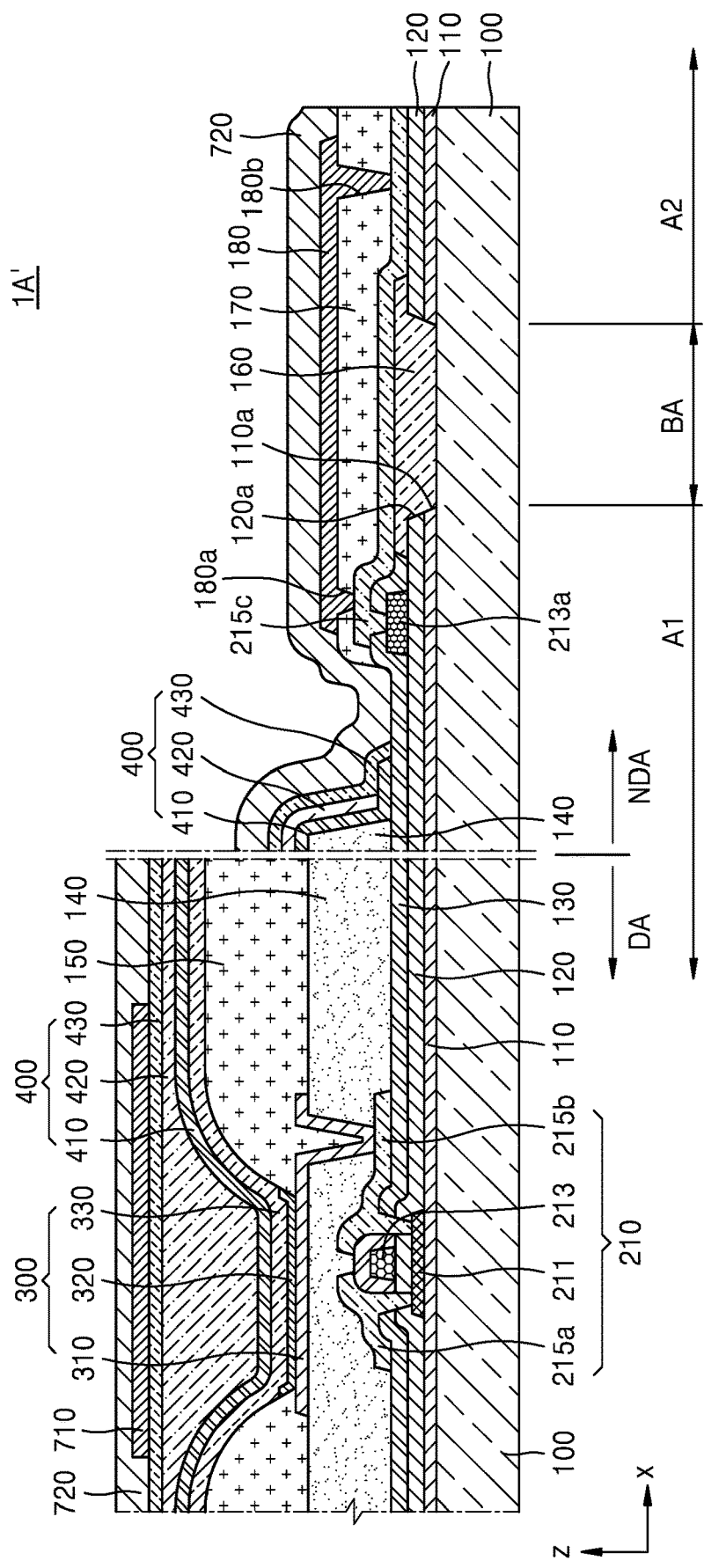
FIG. 3 is a cross-sectional view illustrating a portion of a display device according to another embodiment.

As described above, the organic insulating layer 170 may be between the first conductive layer 215c and the second conductive layer 180. The organic insulating layer 170 insulates portions of the first conductive layer 215c from portions of the second conductive layer 180. Like the organic layer 160, the organic insulating layer 170 may absorb tensile stress applied to the second conductive layer 180 during the bending, and may reduce or minimize the occurrence of a crack in the second conductive layer 180. Although FIG. 2 illustrates the organic insulating layer 170 includes the same material as that of the planarization layer 140, the present embodiment is not limited thereto. As another embodiment, as illustrated in FIG. 3, the organic insulating layer 170 of the display device 1A' may include the same material as that of the pixel-defining layer 150.

Meanwhile, in another embodiment, the organic insulating layer 170 may include the same material as that of the organic encapsulation layer 420. Also, the organic layer 160 and the organic insulating layer 170 may include the same material, or may be made of different materials. For example, in the case where the planarization layer 140 includes a first planarization layer, and a second planarization layer above the first planarization layer, when the organic layer 160 includes the same material as the first planarization layer, the organic insulating layer 170 may include the same material as the second planarization layer. In this case, the material of the first planarization layer may be the same as, or different from, the material of the second planarization layer. As another embodiment, in the case where the organic layer 160 includes the same material as the planarization layer 140, the organic insulating layer 170 may include the same material as the pixel-defining layer 150. Also, as another embodiment, in the case where the organic layer 160 includes the same material as the pixel-defining layer 150, the organic insulating layer 170 may include the same material as the organic encapsulation layer 420.

Meanwhile, as described above, a touch protective layer 720 for protecting the touch electrode 710 may integrally extend to the first region A1, the bending area BA, and the second region A2 above the second conductive layer 180. The touch protective layer 720 may extend up to the second region A2, and may cover the second conductive layer 180, thereby insulating the second conductive layer 180 from the outside, and thereby preventing, or reducing the likelihood of, damage of the second conductive layer 180.

Meanwhile, the display device according to the present embodiment may include a third conductive layer 213a in addition to the first conductive layer 215c. Although FIG. 2 illustrates that the third conductive layer 213a is in only the first region A1, the third conductive layer 213a may be located also in the second region A2. The third conductive layer 213a may be in the first region A1 or the second region A2 such that the third conductive layer 213a is in a layer that is different from a layer in which the first conducive layer 215c is located, and may be electrically connected to the first conductive layer 215c. FIG. 2 illustrates that the third conductive layer 213a includes the same material as that of the gate electrode 213 of the TFT 210 and is in the same layer as a layer in which the gate electrode 213 is above the gate insulating layer 120. Also, FIG. 2 illustrates that the first conductive layer 215c contacts the third conductive layer 213a via a contact hole formed in the interlayer insulating layer 130.

The third conductive layer 213a in the first region A1 may be electrically connected to the TFT, etc. inside the display area DA, and thus the first conductive layer 215c may be electrically connected to the TFT, etc. inside the display area DA via the third conductive layer 213a. In another embodiment, in the case where the third conductive layer 213a is in the second region A2, the third conductive layer 213a may be also electrically connected to the TFT, etc. inside the display area DA via the first conductive layer 215c. As described above, the third conductive layer 213a may be electrically connected to elements inside the display area DA while the third conductive layer 213a is located outside the display area DA, and may extend toward the display area DA, and at least a portion thereof may be inside the display area DA while the third conductive layer 213a is located outside the display area DA.

Therefore, occurrence of a defect, such as a crack in the first conductive layer 215c, or disconnection of the first conductive layer 215c, may be reduced or prevented by allowing the first conductive layer 215c crossing the bending area BA to include a material having high elongation. Also, efficiency of electric signal transfer may increase in the display device, or a defect-occurrence rate during the manufacturing process may be reduced by forming the third conductive layer 213a by using a material having elongation that is lower than that of the first conductive layer 215c, but that has electrical/physical characteristics that are different from those of the first conductive layer 215c in the first region A1 or the second region A2. For example, the third conductive layer 213a may include Mo, and the first conductive layer 215c may include A1. The first conductive layer 215c or the third conductive layer 213a may have a multi-layered structure when suitable.

In the case where the third conductive layer 213a is located also in the second region A2, unlike FIG. 2, the third conductive layer 213a may be electrically connected to various electronic devices or to a printed circuit board, etc. by allowing at least a portion of the upper surface thereof to be uncovered by the planarization layer 140, etc. but to be exposed to the outside.

Figure 4:
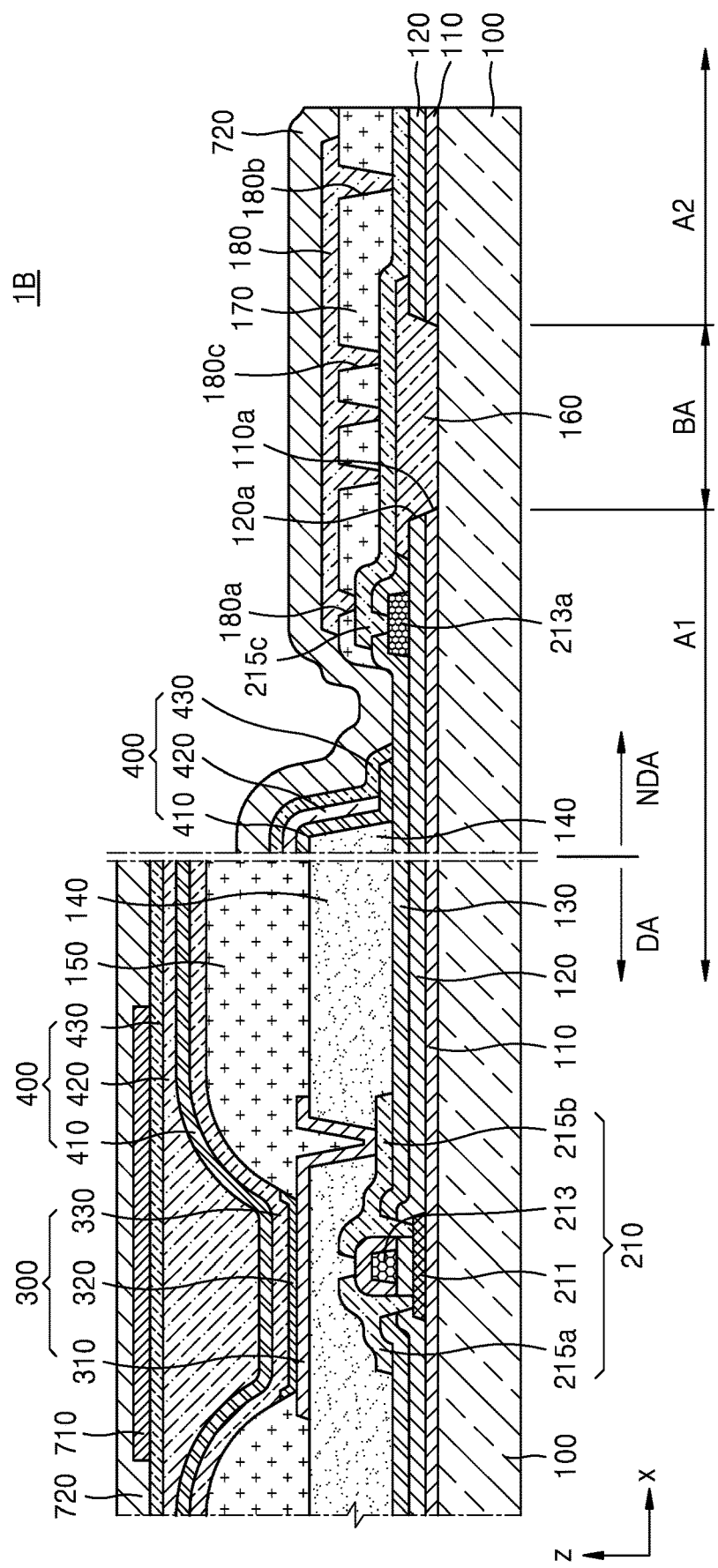
FIG. 4 is a cross-sectional view illustrating a portion of a display device according to another embodiment.

FIG. 4 is a cross-sectional view illustrating a portion of a display device 1B according to another embodiment.

The display device 1B illustrated in FIG. 4 includes the organic insulating layer 170 between the first conductive layer 215c and the second conductive layer 180, and is different from the display device 1A of FIG. 2 in that the organic insulating layer 170 further includes a third contact hole 180c in addition to the first contact hole 180a and the second contact hole 180b, all of which allowing electrical connection of the first conductive layer 215c to the second conductive layer 180. Hereinafter, differences are mainly described, and repeated descriptions of FIG. 2 are omitted.

Referring to FIG. 4, as described above, the first conductive layer 215c and the second conductive layer 180 are electrically connected to each other, and may collectively serve as a wiring (e.g., an integral wiring) and as a so-called multi-path for transferring the same signal. The first conductive layer 215c is electrically connected to the second conductive layer 180 via the first contact hole 180a in the first region A1, and is also electrically connected to the second conductive layer 180 via the second contact hole 180b in the second region A2. The organic insulating layer 170 of the display device according to the present embodiment may further include the third contact hole 180c in addition to the first contact hole 180a and the second contact hole 180b. The third contact hole 180c may be in the bending area BA, and may be provided either as a single contact hole, or as a plurality of contact holes.

Because the organic insulating layer 170 further includes the third contact hole 180c in the bending area BA (in addition to the first contact hole 180a of the first region A1 and the second contact hole 180b of the second region A2), even in the case where a crack occurs in one of the regions, a probability that disconnection of an electric signal of the first conductive layer 215c and the second conductive layer 180 occurs may be reduced.

Figure 5:
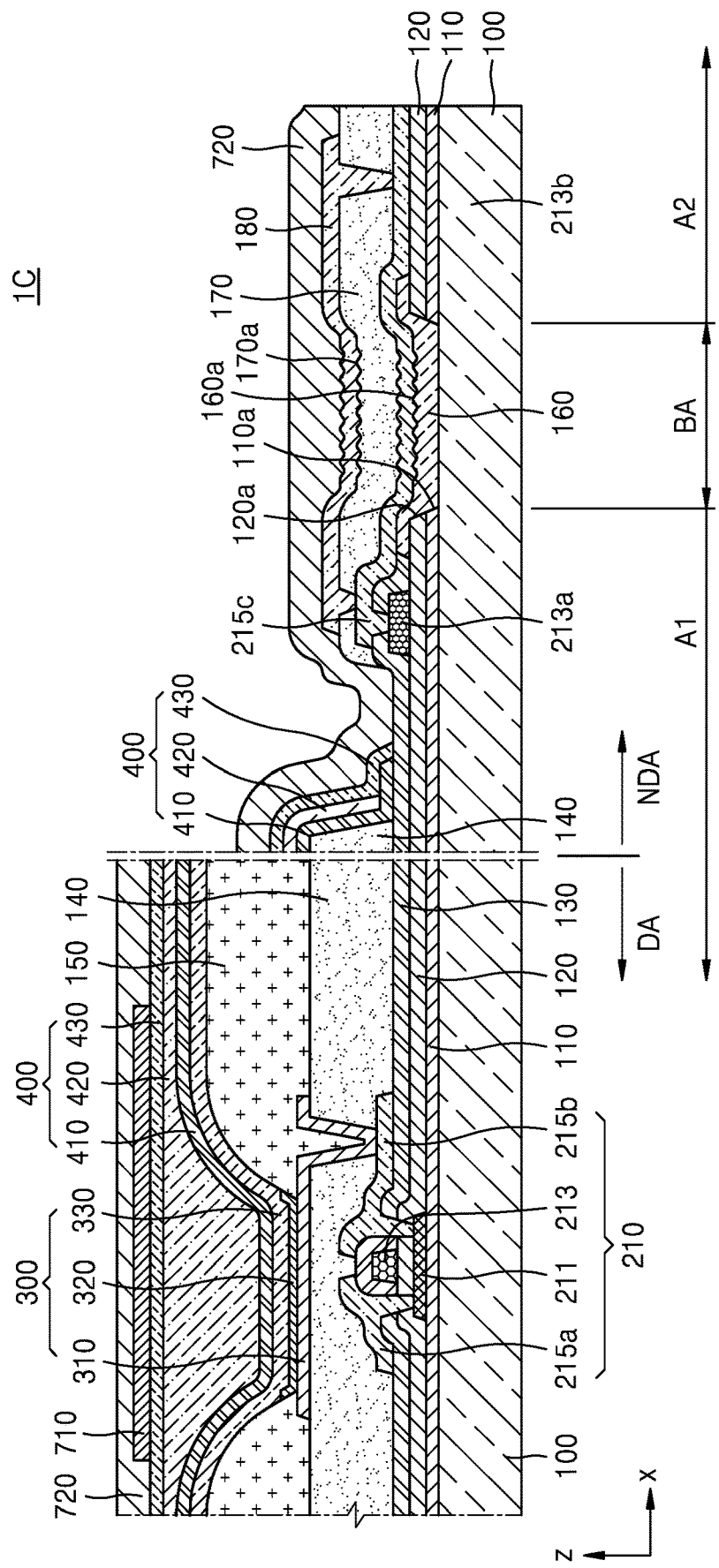
FIG. 5 is a cross-sectional view illustrating a portion of a display device according to another embodiment.
Figure 6:
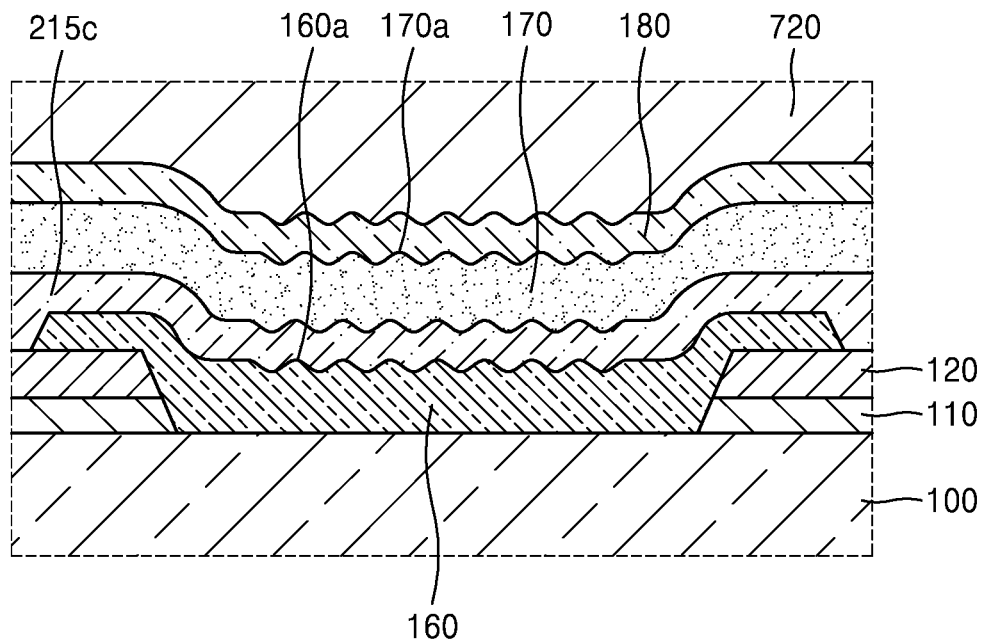
FIG. 6 is a cross-sectional view illustrating a portion of a display device according to another embodiment.

FIG. 5 is a cross-sectional view illustrating a portion of a display device 1C according to another embodiment, FIG. 6 is a cross-sectional view enlarging a portion of FIG. 5, and FIGS. 7 to 10 are cross-sectional views enlarging modifications of the portion of FIG. 5.

Referring to FIGS. 5 and 6, the organic layer 160 according to the present embodiment may include a first uneven (e.g., irregular, or non-planar) surface 160a in at least a portion of an upper surface thereof (+z direction). Because the organic layer 160 includes the first uneven surface 160a, an upper surface and/or a lower surface of the first conductive layer 215c above the organic layer 160 may have a shape corresponding to the first uneven surface 160a of the organic layer 160.

Also, the organic insulating layer 170 may include a second uneven (e.g., irregular, or non-planar) surface 170a in at least a portion of an upper surface thereof (+z direction). Because the organic insulating layer 170 includes the second uneven surface 170a, an upper surface and/or a lower surface of the second conductive layer 180 above the organic insulating layer 170 may have a shape corresponding to the shape of the second uneven surface 170a of the organic insulating layer 170.

As described above, when the substrate 100, etc. are bent in the bending area BA during a manufacturing process, tensile stress may be applied to the first conductive layer 215c and to the second conductive layer 180. The amount of the tensile stress applied to the first conductive layer 215c and the second conductive layer 180 may be reduced or minimized by allowing the upper surface and/or the lower surface of the first conductive layer 215c and the second conductive layer 180 to respectively have shapes corresponding to the first uneven surface 160a of the organic layer 160 and the second uneven surface 170a of the organic insulating layer 170. That is, the tensile stress that may occur during the bending process may be reduced by deformation of the shapes of the organic layer 160 and the organic insulating layer 170. In this case, occurrence of a defect, such as disconnection, etc. in the first conductive layer 215c and the second conductive layer 180 may be effectively prevented by allowing the shapes of the first conductive layer 215c and the second conductive layer 180 to be deformed to correspond to the shapes of the organic layer 160 and the organic insulating layer 170, which are deformed by the bending.

Also, the surface area of the upper surface of the organic layer 160, the surface area of the upper/lower surface of the first conductive layer 215c inside the opening, the surface area of the upper/lower surface of the organic insulating layer 170, and the surface area of the upper/lower surface of the second conductive layer 180 inside the opening may be increased by forming the first uneven surface 160a and the second uneven surface 170a. A fact that the surface areas of the layers in the bending area are relatively large denotes that a margin by which the layers may be deformed to reduce tensile stress by the bending of the substrate 100 increases.

Figure 10:
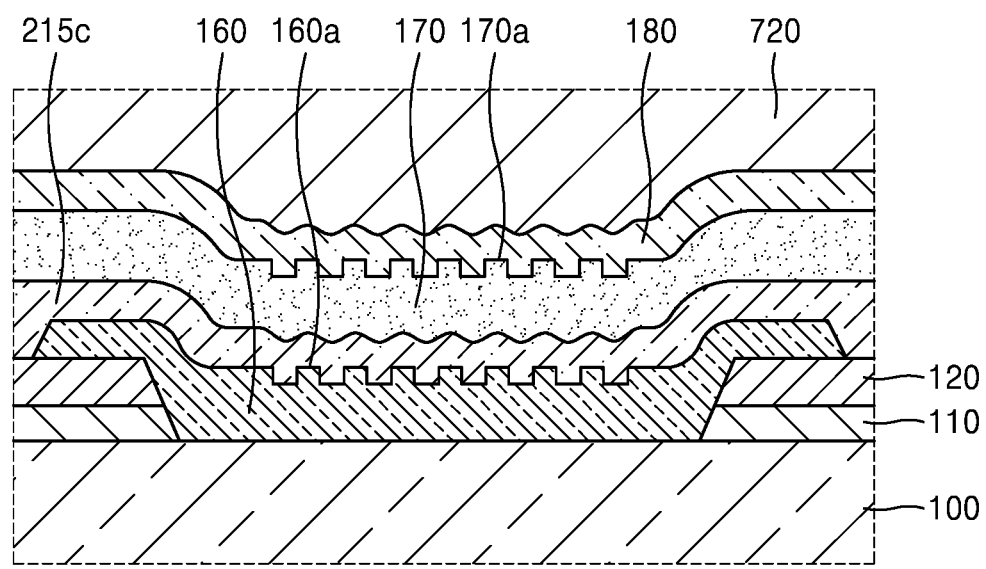
FIG. 10 is a cross-sectional view illustrating a portion of a display device according to another embodiment.

As another embodiment, because the first conductive layer 215c is above the organic layer 160, the lower surface of the first conductive layer 215c has a shape corresponding to the first uneven surface 160a of the organic layer 160, and the lower surface of the second conductive layer 180 has a shape corresponding to the second uneven surface 170a of the organic insulating layer 170. However, as illustrated in FIG. 10, the upper surface of the first conductive layer 215c may have an uneven surface that may be of an independent shape that does not correspond to the first uneven surface 160a of the organic layer 160. Likewise, the upper surface of the second conductive layer 180 may have an uneven surface, and may have an uneven surface of an independent shape not corresponding to the second uneven surface 170a of the organic insulating layer 170.

The first uneven surface 160a of the organic layer 160 and the second uneven surface 170a of the organic insulating layer 170 may be formed by using various methods. For example, a photoresist material may be used when forming the organic layer 160 or the organic insulating layer 170, and a specific portion may be etched (removed) relatively further, or more, than other portions by differing the amount of exposure applied to the portions of the organic layer 160 or the organic insulating layer 170, which have upper surfaces that are initially approximately planarized, via a slit mask or a half-tone mask during a manufacturing process. Here, the further etched portion(s) may be understood as a concave portion in the upper surface of the organic layer 160 or in the organic insulating layer 170. The method used when manufacturing the display device according to other embodiments is not limited to the above method. For example, after forming the organic layer 160 or the organic insulating layer 170, which each have an upper surface that is approximately planarized, suitable portions may be selectively removed by using dry etching, etc., and various methods may be used.

Meanwhile, to allow the organic layer 160 to include the first uneven surface 160a at the upper surface thereof (+z direction), the organic layer 160 may include a plurality of first grooves extending in the first direction (+y direction) in the upper surface thereof (+z direction). In this case, the shape of the lower surface of the first conductive layer 215c corresponds to the shape of the upper surface of the organic layer 160. Likewise, to allow the organic insulating layer 170 to include the second uneven surface 170a at the upper surface thereof (+z direction), the organic insulating layer 170 may include a plurality of second grooves extending in the first direction (+y direction) at the upper surface thereof (+z direction). In this case, the shape of the lower surface of the second conductive layer 180 corresponds to the shape of the upper surface of the organic insulating layer 170. The plurality of first grooves may be in the upper surface of the organic layer 160, and may extend in the first direction (+y direction), which is the same as the direction of the bending axis BAX, and the plurality of second grooves may be in the upper surface of the organic insulating layer 170, and may also extend in the first direction (+y direction).

The organic layer 160 may have the first uneven surface 160a only inside the opening of the inorganic insulating layer. Also, the organic insulating layer 170 may have the second uneven surface 170a only inside the opening of the inorganic insulating layer. That is, the organic layer 160 and the organic insulating layer 170 may respectively have the uneven surfaces 160a and 170a only at locations corresponding to the bending area BA.

Figure 7:
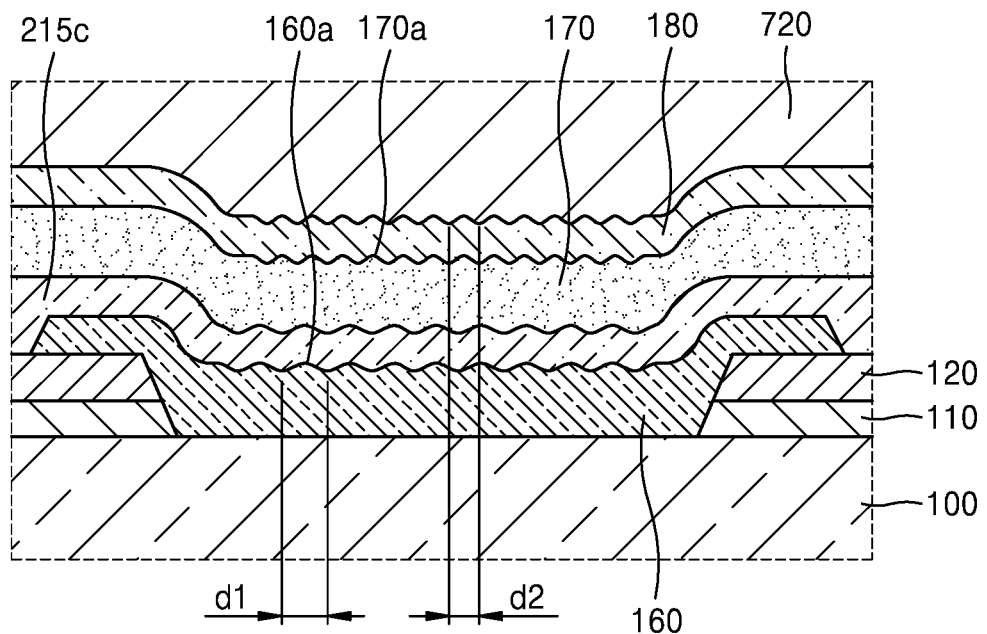
FIG. 7 is a cross-sectional view illustrating a portion of a display device according to another embodiment.

Meanwhile, referring to FIG. 7, the plurality of first grooves of the organic layer 160 may be repeated at a first period (e.g., the first grooves may be separated from each other by a first distance to repeat with a first frequency) and the plurality of second grooves of the organic insulating layer 170 may be repeated at a second period. Here, a fact that the plurality of first grooves of the organic layer 160 are repeated at the first period may denote that a distance between most adjacent first grooves, or neighboring ones of the first grooves, from among the plurality of first grooves of the organic layer 160 is repeated by a constant first distance d1. Also, a fact that the plurality of second grooves of the organic insulating layer 170 are repeated at the second period may denote that a distance between most adjacent second grooves from among the plurality of second grooves of the organic insulating layer 170 is repeated by a constant second distance d2.

According to the present embodiment, as illustrated in FIG. 7, the second distance d2 between the plurality of second grooves of the organic insulating layer 170 may be less than the first distance d1 between the plurality of first grooves of the organic layer 160. As described above, when the substrate 100 is bent in the bending area BA, the second conductive layer 180, which is located at a relatively farther distance from the upper surface of the substrate 100, receives greater tensile stress than the first conductive layer 215c, which is located at a relatively closer distance to the upper surface of the substrate 100. Therefore, the surface area of the upper surface of the second conductive layer 180 may be larger than the surface area of the upper surface of the first conductive layer 215c by forming the second distance d2 between the plurality of second grooves of the organic insulating layer 170 to be less than the first distance d1 between the plurality of first grooves of the organic layer 160. Through this, the tensile stress applied to the substrate 100 when the substrate 100 is bent may be effectively dispersed.

Figure 8:
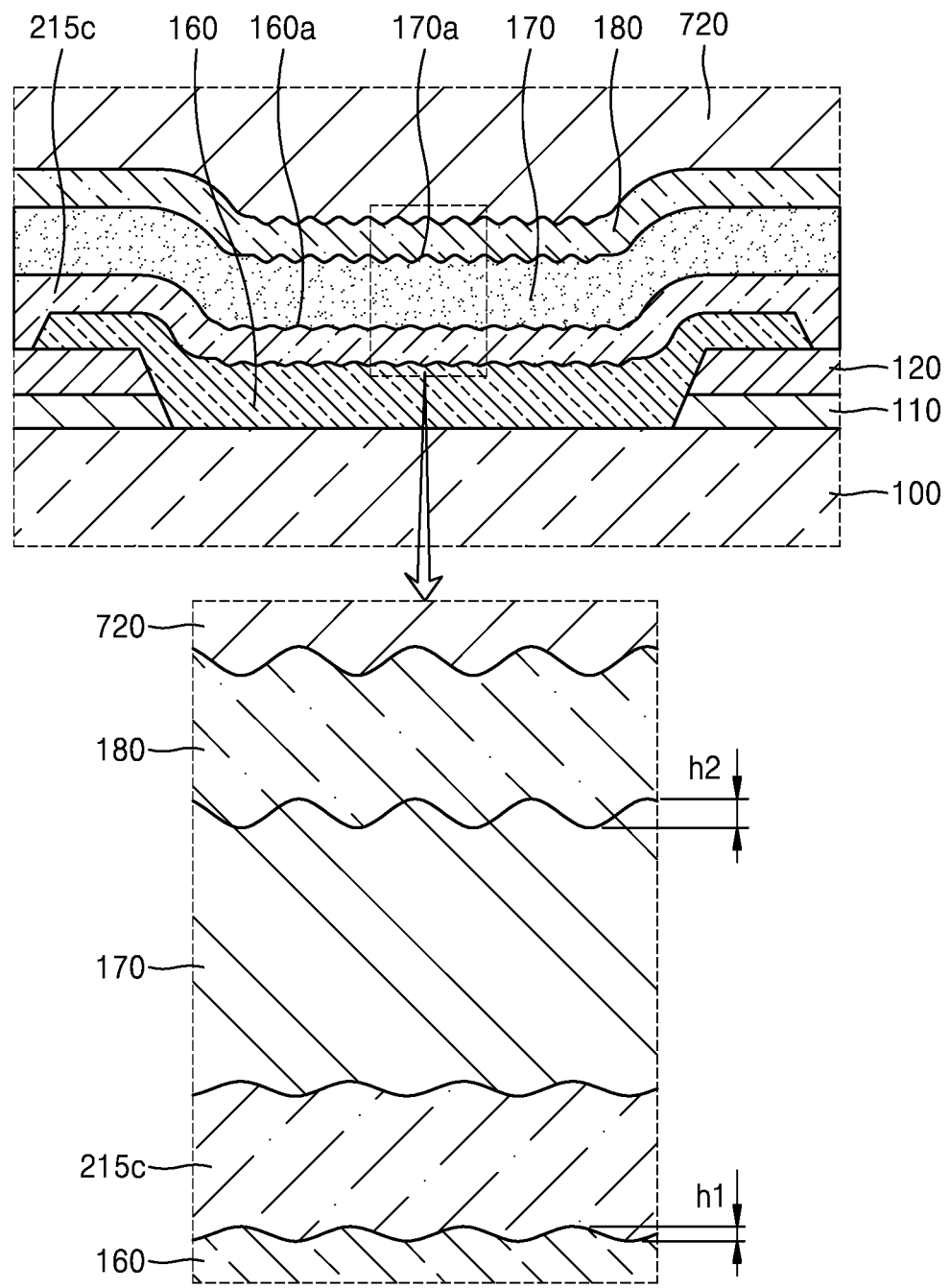
FIG. 8 is a cross-sectional view illustrating a portion of a display device according to another embodiment.

Meanwhile, referring to FIG. 8, in the second direction (+x direction) that crosses the first direction (+y direction), and therefore also crosses the direction of the bending axis BAX, the first uneven surface 160a of the organic layer 160 may include a plurality of first protrusions, and the second uneven surface 170a of the organic insulating layer 170 may include a plurality of second protrusions. In this case, the plurality of first protrusions may have a first height h1, and the plurality of second protrusions may have a second height h2. The first height h1 of the plurality of first protrusions may be defined as a step difference between a concave portion and a convex portion of the first uneven surface 160a of the organic layer 160 (e.g., the first height h1 may be thought of as an elevation difference between peaks and valleys of the first uneven surface 160a of the organic layer 160). Likewise, the second height h2 of the plurality of second protrusions may be defined as a step difference between a concave portion and a convex portion of the second uneven surface 170a of the organic insulating layer 170.

According to the present embodiment, the second height h2 of the plurality of second protrusions may be greater than the first height h1 of the plurality of first protrusions. This denotes that the step difference of the plurality of second protrusions is greater than the step difference of the plurality of first protrusions. As described above, when the substrate 100 is bent in the bending area BA, the second conductive layer 180, which is located at a relatively farther distance from the upper surface of the substrate 100 than the first conductive layer 215c, receives greater tensile stress than the first conductive layer 215c, which is located at a relatively closer distance to the upper surface of the substrate 100. Therefore, the surface area of the upper surface of the second conductive layer 180 may be greater than the surface area of the upper surface of the first conductive layer 215c due to the second height h2 of the plurality of second protrusions of the organic insulating layer 170 being formed to be higher than the first height h1 of the plurality of first protrusions of the organic layer 160. Through this, the tensile stress applied to the substrate 100 when the substrate 100 is bent may be effectively dispersed or reduced.

Figure 9:
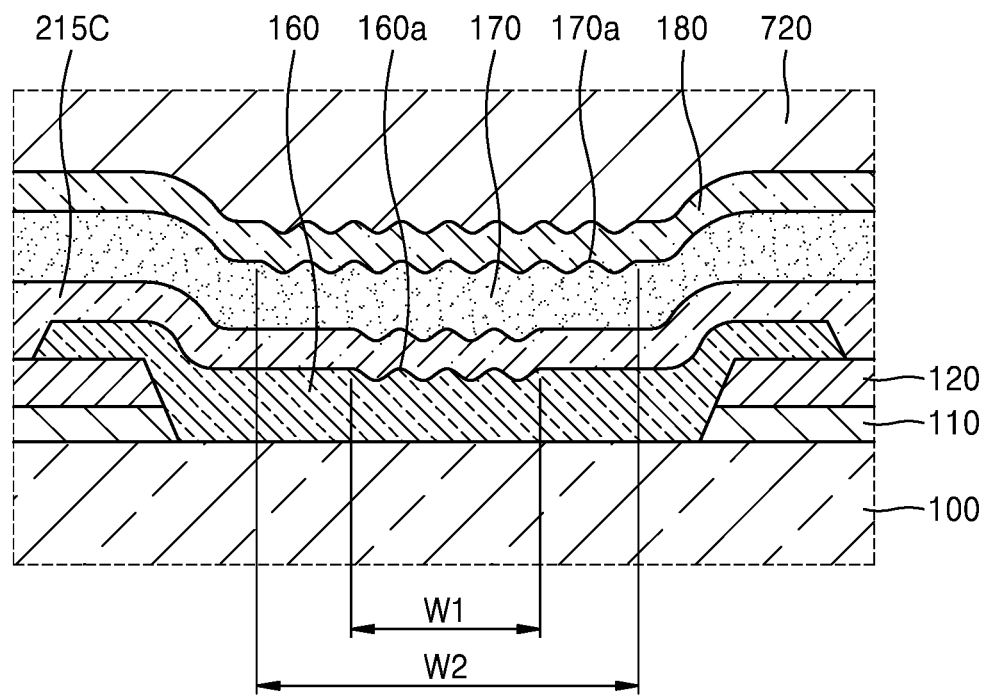
FIG. 9 is a cross-sectional view illustrating a portion of a display device according to another embodiment.

Meanwhile, referring to FIG. 9, the first uneven surface 160a of the organic layer 160 may be formed to have a first area or width w1, and the second uneven surface 170a of the organic insulating layer 170 may be formed to have a second area or width w2. In FIG. 9, the first area w1 has been illustrated as the width of an entirety of the first uneven surface 160a, and the second area w2 has been illustrated as the width of an entirety of the second uneven surface 170a.

According to the present embodiment, the second area or width w2 of the second uneven surface 170a of the organic insulating layer 170 may be greater than the first area or width w1 of the first uneven surface 160a of the organic layer 160. As illustrated in FIG. 9, the second uneven surface 170a having the relatively wider second area or width w2 may therefore include a greater number of grooves and protrusions than the number of grooves and protrusions of the first uneven surface 160a having the relatively narrower first area or width w1. As described above, when the substrate 100 is bent in the bending area BA, the second conductive layer 180, which is located at a relatively farther distance from the upper surface of the substrate 100, receives greater tensile stress than the first conductive layer 215c, which is located at a relatively closer distance to the upper surface of the substrate 100. Therefore, the surface area of the upper surface of the second conductive layer 180 may be wider or greater than the surface area of the upper surface of the first conductive layer 215c by forming the second area w2 of the second uneven surface 170a of the organic insulating layer 170 to be wider or greater than the first area w1 of the first uneven surface 160a of the organic layer 160. Through this, the tensile stress applied to the substrate 100 when the substrate 100 is bent may be effectively dispersed.

Meanwhile, referring to FIG. 10, the first uneven surface 160a of the organic layer 160 and the second uneven surface 170a of the organic insulating layer 170 according to the present embodiment may be patterned to have a suitable pattern. In this case, as illustrated in FIG. 10, the lower surface of the first conductive layer 215c, which is above the organic layer 160, corresponds to the shape of the upper surface of the organic layer 160, although the first uneven surface 160a may have a different shape than the upper surface of the first conductive layer 215c. Also, the lower surface of the second conductive layer 180, which is above the organic insulating layer 170, corresponds to the shape of the upper surface of the organic insulating layer 170, although the second uneven surface 170a may have a different shape than the upper surface of the second conductive layer 180.

Figure 11:
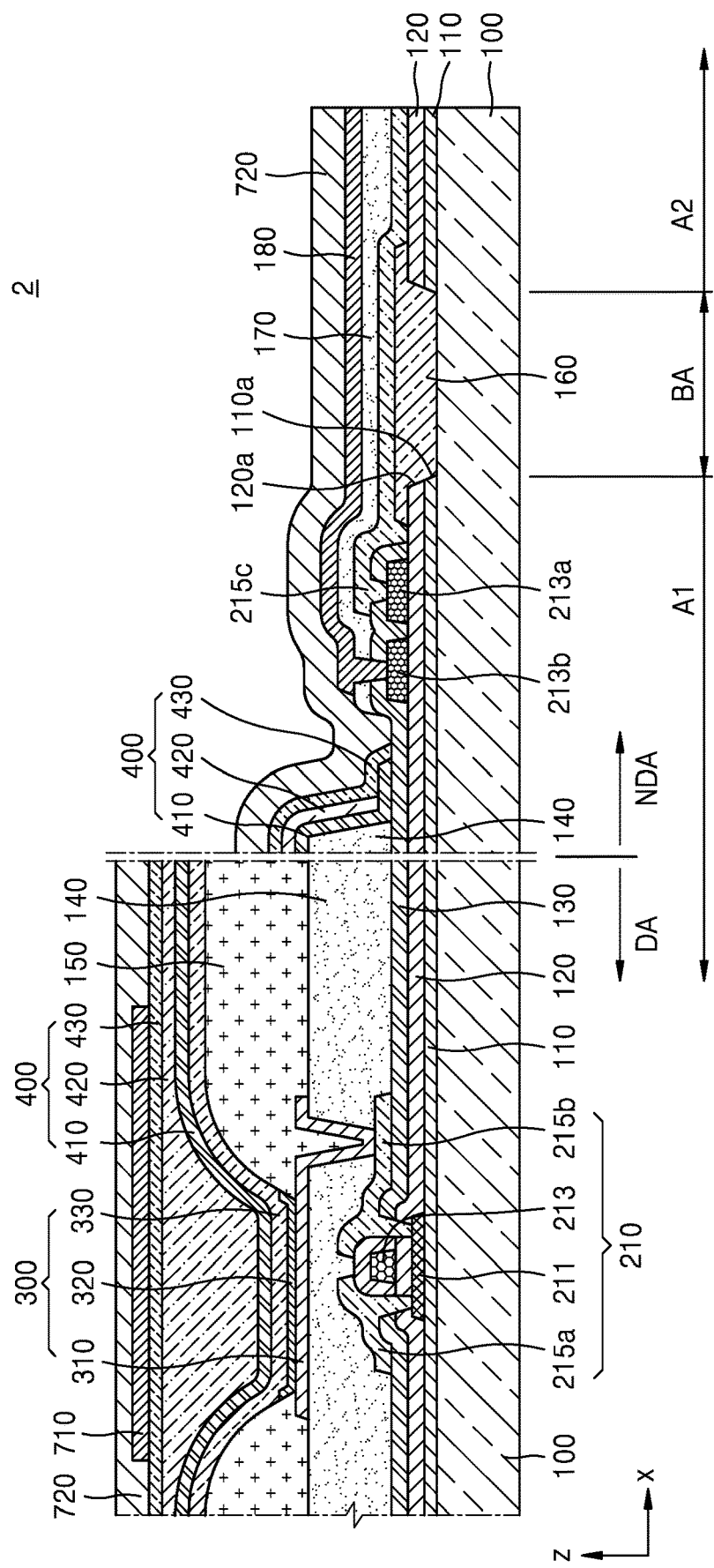
FIG. 11 is a cross-sectional view illustrating a portion of a display device according to another embodiment.
Figure 12:
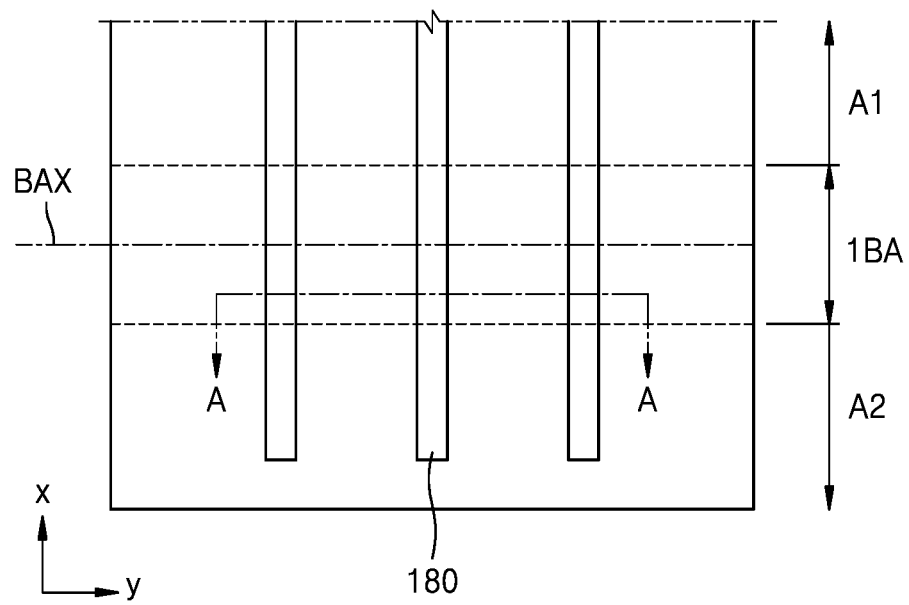
FIGS. 12 and 13 are a plan view and a cross-sectional view, respectively, illustrating a portion of a display device according to another embodiment.
Figure 13:
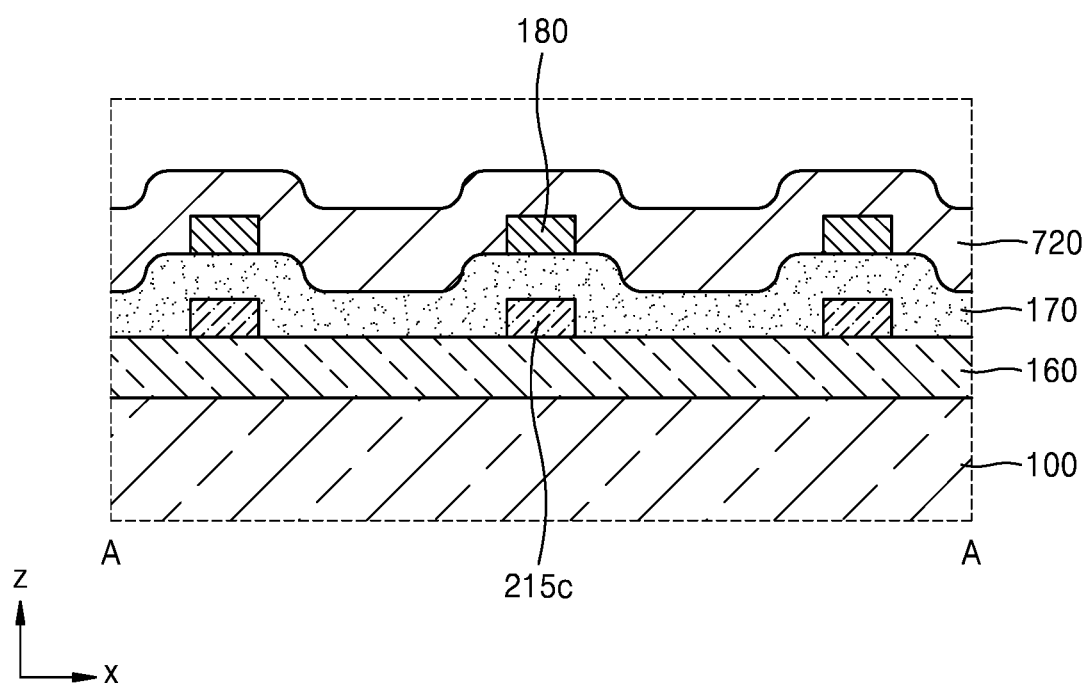
Figure 14:
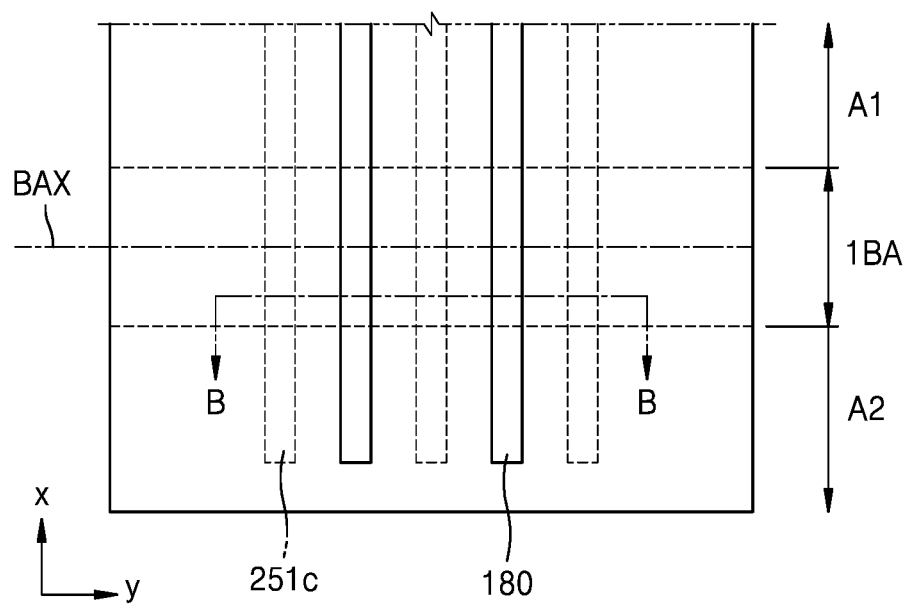
FIGS. 14 and 15 are a plan view and a cross-sectional view, respectively, illustrating a portion of a display device according to another embodiment.
Figure 15:
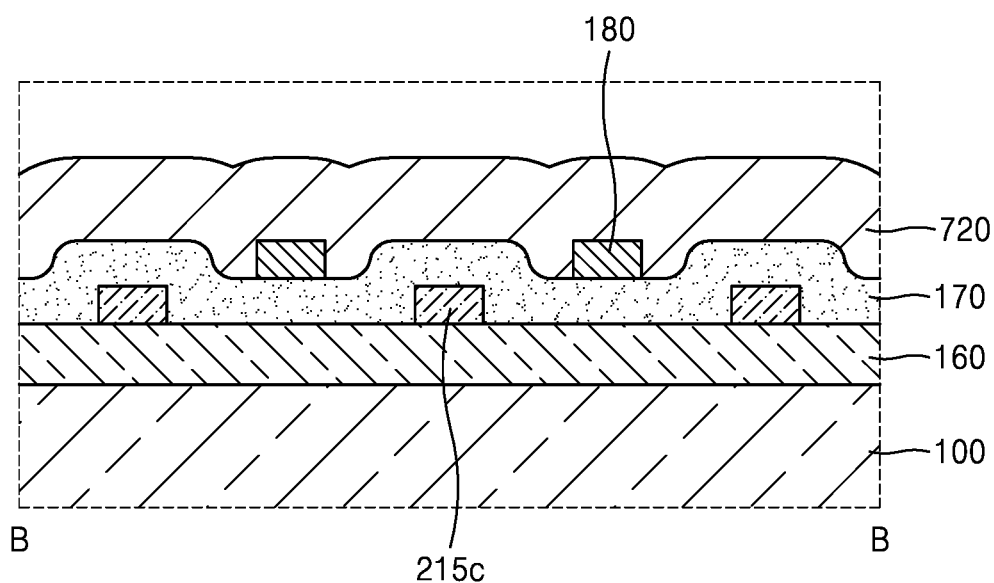

FIG. 11 is a cross-sectional view illustrating a portion of a display device 2 according to another embodiment, FIGS. 12 and 13 are a plan view and a cross-sectional view, respectively, illustrating a portion of a display device according to another embodiment, and FIGS. 14 and 15 are a plan view and a cross-sectional view, respectively, illustrating a portion of a display device according to another embodiment.

The display device 2 illustrated in FIG. 11 includes the organic insulating layer 170 between the first conductive layer 215c and the second conductive layer 180, and is different from the display device 1A of FIG. 2 in that the organic insulating layer 170 insulates the first conductive layer 215c from the second conductive layer 180 without electric contact (e.g., without contact holes 180a or 180b). Also, because the display device 2 illustrated in FIG. 11 has the substantially same structure as that of the display device 1A of FIG. 2 in the display area DA, differences are mainly described below, and repeated descriptions of FIG. 2 are omitted.

Referring to FIG. 11, in the display device according to the present embodiment, the inorganic insulating layer includes an opening corresponding to the bending area BA, and the organic layer 160 located at at least a portion of the opening of the inorganic insulating layer is provided. Although FIG. 11 illustrates that the organic layer 160 completely fills, or occupies, the opening, and thus the upper surface of the organic layer 160 is planarized, the organic layer 160 may be disposed along the shape of the opening according to another embodiment. The organic layer 160 may be formed by a separate process, and may be formed (e.g., formed concurrently, or simultaneously) during a same process of forming some layers of the display portion.

Also, the display device according to the present embodiment includes the first conductive layer 215c. The first conductive layer 215c extends from the first region A1 to the second region A2 through the bending area BA, and is above the organic layer 160. The first conductive layer 215c may be above the inorganic insulating layer, such as the gate insulating layer 120 or the interlayer insulating layer 130, in a region where the organic layer 160 is omitted. The first conductive layer 215c may include the same material as that of the source electrode 215a or the drain electrode 215b, and may be formed with (e.g., formed simultaneously with, or during a same process as) the source electrode 215a or the drain electrode 215b.

The display device according to the present embodiment includes the second conductive layer 180 in addition to the first conductive layer 215c. The second conductive layer 180 extends from the first region A1 to the second region A2 through the bending area BA, and is above the first conductive layer 215c. The organic insulating layer 170 may be between the first conductive layer 215c and the second conductive layer 180. For example, although the second conductive layer 180 may include the same material as that of the touch electrode 710, other embodiments are not limited thereto.

As described above, in the display device according to an embodiment, because the inorganic insulating layer has the opening in the bending area BA, a probability that a crack occurs in the inorganic insulating layer is reduced, and the organic layer 160 may absorb tensile stress that occurs by bending of the substrate 100, etc., thereby preventing or minimizing the occurrence of a defect in the first conductive layer 215c and the second conductive layer 180 during the bending process.

Meanwhile, as illustrated in FIG. 11, the first conductive layer 215c may include the same material as that of the source electrode 215a or the drain electrode 215b of the TFT 210. In this case, although the second conductive layer 180 may include the same material as that of the touch electrode 710, other embodiments are not limited thereto. As another embodiment, the second conductive layer 180 may include the same material as that of the opposite electrode 330, and may be formed when forming the opposite electrode 330 (e.g., may be formed simultaneously with, or during a same process as, the opposite electrode 330).

The organic insulating layer 170 may be between the first conductive layer 215c and the second conductive layer 180. The organic insulating layer 170 insulates the first conductive layer 215c from the second conductive layer 180, and like the organic layer 160, may absorb tensile stress applied to the second conductive layer 180 during the bending, and may reduce or minimize the likelihood of an occurrence of a crack in the second conductive layer 180. Although FIG. 11 illustrates that the organic insulating layer 170 includes the same material as that of the planarization layer 140, the embodiment is not limited thereto. As another embodiment, the organic insulating layer 170 may include the same material as that of the pixel-defining layer 150.

In other embodiments, the organic insulating layer 170 may include the same material as that of the organic encapsulation layer 420. Also, the organic layer 160 and the organic insulating layer 170 may include the same material, or may include different materials. For example, in the case where the planarization layer 140 includes a first planarization layer, and a second planarization layer that is above the first planarization layer, and when the organic layer 160 includes the same material as that of the first planarization layer, the organic insulating layer 170 may include the same material as that of the second planarization layer. In this case, the material of the first planarization layer and the material of the second planarization layer may be the same, or may be different from each other.

As another embodiment, in the case where the organic layer 160 includes the same material as that of the planarization layer 140, the organic insulating layer 170 may include the same material as that of the pixel-defining layer 150. Also, as another embodiment, in the case where the organic layer 160 includes the same material as that of the pixel-defining layer 150, the organic insulating layer 170 may include the same material as that of the organic encapsulation layer 420.

Meanwhile, as described above, the touch protective layer 720 for protecting the touch electrode 710 may integrally extend to the first region A1, to the bending area BA, and to the second region A2 above the second conductive layer 180. The touch protective layer 720 may insulate the second conductive layer 180 from the outside, and may prevent damage of the second conductive layer 180, or may reduce the likelihood thereof, by extending up to the second region A2, and by covering the second conductive layer 180.

Meanwhile, the display device according to the present embodiment includes the third conductive layer 213a and also includes a fourth conductive layer 213b. As illustrated in FIG. 11, the third conductive layer 213a may be electrically connected to the first conductive layer 215c via a contact hole, and the fourth conductive layer 213b may be electrically connected to the second conductive layer 180 via a contact hole. Although FIG. 11 illustrates that the third conductive layer 213a and the fourth conductive layer 213b are located only in the first region A1, the third conductive layer 213a and the fourth conductive layer 213b may be located also in the second region A2. The third conductive layer 213a and the fourth conductive layer 213b may be in the same layer, or may be in different layers. FIG. 11 illustrates the case where the third conductive layer 213a and the fourth conductive layer 213b are in the same layer, and for example, the third conductive layer 213a and the fourth conductive layer 213b may be above the gate insulating layer 120. In this case, although the third conductive layer 213a and the fourth conductive layer 213b may include the same material as that of the gate electrode 213 of the TFT 210, other embodiments are not limited thereto.

The interlayer insulating layer 130 may be above the third conductive layer 213a and the fourth conductive layer 213b. Therefore, the first conductive layer 215c above the interlayer insulating layer 130 may be electrically connected to the third conductive layer 213a via a contact hole formed in the interlayer insulating layer 130. Also, the second conductive layer 180 above the fourth conductive layer 213b may be electrically connected to the fourth conductive layer 213b via a contact hole formed in the interlayer insulating layer 130 and in the organic insulating layer 170.

The third conductive layer 213a and the fourth conductive layer 213b in the first region A1 may be electrically connected to a TFT, etc. inside the display area DA, and thus the first conductive layer 215c may be electrically connected to a TFT, etc. inside the display area DA via the third conductive layer 213a, and the second conductive layer 180 may be electrically connected to a TFT, etc. inside the display area DA via the fourth conductive layer 213b.

In other embodiments, when the third conductive layer 213a and the fourth conductive layer 213b are located also in the second region A2, the third conductive layer 213a in the second region A2 may be also electrically connected to a TFT, etc. inside the display area DA via the first conductive layer 215c, and the fourth conductive layer 213b in the second region A2 may be also electrically connected to a TFT, etc. inside the display area DA via the second conductive layer 180. As described above, the third conductive layer 213a and the fourth conductive layer 213b may be electrically connected to elements inside the display area DA while they are located outside the display area DA. While the third conductive layer 213a and the fourth conductive layer 213b are located outside the display area DA, they may extend in a direction of the display area DA such that at least a portion of them is inside the display area DA.

Occurrence of a defect, such as a crack in the first conductive layer 215c or the second conductive layer 180, or such as disconnection of the first conductive layer 215c or the second conductive layer 180, may be reduced or prevented by allowing the first and second conductive layers 215c and 180 crossing the bending area BA to include a material having high elongation. Also, efficiency of electric signal transfer may increase in the display device, or a defect occurrence rate during the manufacturing process may be reduced by forming the third and fourth conductive layers 213a and 213b by using a material having elongation that is lower than those of the first and second conductive layers 215c and 180, but also having electrical/physical characteristics that are different from those of the first and second conductive layers 215c and 180 in the first region A1 or the second region A2. For example, the third and fourth conductive layers 213a and 213b may include Mo, and the first and second conductive layers 215c and 180 may include Al. The first conductive layer 215c to the fourth conductive layer 213b may have a multi-layered structure when suitable.

In other embodiments, unlike FIG. 11, the third conductive layer 213a and/or the fourth conductive layer 213b in the second region A2 may be electrically connected to various electronic devices or a printed circuit board, etc. by allowing at least a portion of the upper surface thereof to be uncovered by the planarization layer 140, etc. to instead be exposed to the outside.

Meanwhile, in the display device 2 according to the present embodiment, unlike the display device 1A of FIG. 2, the first conductive layer 215c and the second conductive layer 180 are not electrically connected to each other, and thus serve as separate wirings for transferring different signals, and do not serve as an integral wiring transferring the same signal. For this purpose, as described above, the first conductive layer 215c contacts the third conductive layer 213a, and the second conductive layer 180 contacts the fourth conductive layer 213b.

In the display device, an area in which the first conductive layer 215c and the second conductive layer 180 may be above the substrate may be limited by the area of the substrate and by the area of the display portion, etc. Furthermore, the non-display area NDA in which the first conductive layer 215c and the second conductive layer 180 are located has a tendency to gradually narrow. Therefore, there is a limit in disposing, in the plural above one layer, the first conductive layer 215c and the second conductive layer 180 for supplying a data signal, etc. for allowing the display portion to display an image to the outside. Therefore, in the display device according to the present embodiment, the organic insulating layer 170 is between the first conductive layer 215c and the second conductive layer 180, thus the first conductive layer 215c and the second conductive layer 180 are respectively in different layers, a limit of the area in which wirings may be located on a plane is exceeded, and a wiring structure having a multi-layered structure may be implemented. Through this, the display device according to the present embodiment may increase the number of channels of wirings without being limited to the area of the non-display area NDA, and may thus effectively display an image of high resolution.

Meanwhile, FIG. 12 is a plan view enlarging a portion of a display device according to another embodiment, and FIG. 13 is a cross-sectional view taken along the line A-A of FIG.

12. The line A-A of FIG. 12 follows the first direction (+y direction), which is in the same direction as the bending axis BAX.

Referring to FIGS. 12 and 13, the first conductive layer 215c and the second conductive layer 180 may be respectively in different layers. As described above, the first conductive layer 215c may be above the organic layer 160, and the second conductive layer 180 may be above the organic insulating layer 170. In the present embodiment, the first conductive layer 215c may overlap the second conductive layer 180. Although FIG. 13 illustrates that the second conductive layer 180 completely overlaps the first conductive layer 215c, the embodiment is not limited thereto. The second conductive layer 180 may at least partially overlap the first conductive layer 215c.

Meanwhile, FIG. 14 is a plan view enlarging a portion of a display device according to another embodiment, and FIG. 15 is a cross-sectional view taken along the line B-B of FIG. 14. The line B-B of FIG. 15 follows the first direction (+y direction), which is in the same direction as the bending axis BAX.

Referring to FIGS. 14 and 15, unlike the embodiment of FIGS. 12 and 13, the first conductive layer 215c might not overlap the second conductive layer 180. That is, as illustrated in FIG. 15, the first conductive layer 215c and the second conductive layer 180 may be alternately disposed. This is for preventing tensile stress from being concentrated on a portion in which the first conductive layer 215c overlaps the second conductive layer 180.

Although the inventive concept has been described with reference to the embodiments illustrated in the drawings, but this is merely exemplary and it will be understood by those of ordinary skill in the art that various changes in form and details and equivalents thereof may be made therein without departing from the spirit and scope of the inventive concept as defined by the following claims and their functional equivalents.

What is claimed is:

1. A display device comprising:
    a substrate comprising a bending area extending in a first direction, and located between a first region and a second region in a second direction that crosses the first direction, wherein the first region and the second region are spaced apart from each other with the bending area interposed therebetween;
    a first conductive layer above the substrate, and extending from the first region to the second region through the bending area;
    a second conductive layer above the first conductive layer, and extending from the first region to the second region through the bending area;
    an organic insulating layer between the first conductive layer and the second conductive layer;
    an inorganic insulating layer above the substrate, and having an opening at the bending area; and
    an organic layer in at least a portion of the opening.

2. The display device of claim 1, wherein an upper surface of the organic layer comprises a first uneven surface, and
    wherein an upper surface of the organic insulating layer comprises a second uneven surface.

3. The display device of claim 2, wherein the first uneven surface comprises a plurality of first grooves repeated at a first period, and
    wherein the second uneven surface comprises a plurality of second grooves repeated at a second period that is different from the first period.

4. The display device of claim 3, wherein the second period of the second uneven surface is less than the first period of the first uneven surface.

5. The display device of claim 3, wherein the plurality of first grooves are at an upper surface of the organic layer, and extend in the first direction, and
    wherein the second grooves are at an upper surface of the organic insulating layer, and extend in the first direction.

6. The display device of claim 2, wherein the first uneven surface comprises a plurality of first protrusions having a first height,
    wherein the second uneven surface comprises a plurality of second protrusions in a second direction crossing the first direction and having a second height that is greater than the first height.

7. The display device of claim 2, wherein the first uneven surface and the second uneven surface correspond to the opening.

8. The display device of claim 2, wherein a shape of a lower surface of the second conductive layer that is above the organic insulating layer corresponds to a shape of the organic insulating layer.

9. The display device of claim 2, wherein the first uneven surface has a first area, and
    wherein the second uneven surface has a second area that is greater than the first area.

10. The display device of claim 1, wherein a shape of a lower surface of the first conductive layer that is above the organic layer corresponds to a shape of an upper surface of the organic layer.

11. The display device of claim 1, wherein the organic insulating layer has a first contact hole in the first region and has a second contact hole in the second region, and
    wherein the first conductive layer is electrically connected to the second conductive layer via the first contact hole and the second contact hole.

12. The display device of claim 11, wherein the organic insulating layer has a third contact hole in the bending area, and
    wherein the first conductive layer is electrically connected to the second conductive layer via the third contact hole.

13. The display device of claim 11, further comprising a third conductive layer above the inorganic insulating layer in the first region, the first and second conductive layers being electrically connected to the third conductive layer.

14. The display device of claim 13, further comprising a thin film transistor in the first region or the second region, and comprising a source electrode, a drain electrode, and a gate electrode,
    wherein the third conductive layer comprises a same material as the gate electrode.

15. The display device of claim 1, further comprising a third conductive layer and a fourth conductive layer above the inorganic insulating layer in the first region,
    wherein the first conductive layer is electrically connected to the third conductive layer, and
    wherein the second conductive layer is electrically connected to the fourth conductive layer.

16. The display device of claim 15, wherein the second conductive layer overlaps the first conductive layer.

17. The display device of claim 15, wherein the second conductive layer does not overlap the first conductive layer.

18. The display device of claim 15, further comprising a thin film transistor in the first region or in the second region, and comprising a source electrode, a drain electrode, and a gate electrode,
   wherein the third conductive layer and the fourth conductive layer comprise a same material as the gate electrode.

19. The display device of claim 1, further comprising:
   a thin film transistor in the first region or the second region, and comprising a source electrode, a drain electrode, and a gate electrode;
   a planarization layer above the thin film transistor, and covering the thin film transistor;
   a pixel electrode electrically connected to the thin film transistor;
   a pixel-defining layer above the planarization layer, and defining a pixel region by exposing a central portion of the pixel electrode;
   an encapsulation layer covering a display element in the first region; and
   a touch electrode for a touchscreen above the encapsulation layer,
   wherein the first conductive layer comprises a same material as the source electrode or the drain electrode.

20. The display device of claim 19, wherein the second conductive layer comprises a same material as the touch electrode.

21. The display device of claim 19, wherein the organic insulating layer comprises a same material as the planarization layer or the pixel-defining layer.

22. The display device of claim 19, wherein the encapsulation layer comprises an inorganic encapsulation layer, and an organic encapsulation layer comprising a same material as the organic insulating layer.

23. A display device comprising:
   a substrate comprising a bending area, a first region, and a second region, wherein the first region and the second region are spaced apart from each other with the bending area interposed therebetween;
   an inorganic insulating layer on the substrate, and having an opening at the bending area; and
   an organic layer being located in at least a portion of the opening.

24. The display device of claim 23, further comprising:
   a first conductive layer above the inorganic insulating layer and above the organic layer;
   a second conductive layer above the first conductive layer; and
   an organic insulating layer between the first conductive layer and the second conductive layer.

25. The display device of claim 24, wherein the first conductive layer is electrically connected to the second conductive layer through one or more holes in the organic insulating layer.

26. The display device of claim 24, wherein at least one of the organic layer, the first conducive layer, or the second conductive layer comprises an uneven surface at the bending area for reducing or dispersing stress due to bending at the bending area.

27. The display device of claim 23, wherein the inorganic insulating layer comprises at least one of a buffer layer, a gate insulating layer, or an interlayer insulating layer, and extends to a thin film transistor in a display area outside the bending area.

\* \* \* \* \*